United States Patent
Sakihama et al.

(10) Patent No.: US 7,509,612 B2
(45) Date of Patent: Mar. 24, 2009

(54) METHOD OF DESIGNING SEMICONDUCTOR CHIP AND PROGRAM FOR USE IN DESIGNING SEMICONDUCTOR CHIP

(75) Inventors: Kazuhisa Sakihama, Yokohama (JP); Toru Takahashi, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 347 days.

(21) Appl. No.: 11/357,641

(22) Filed: Feb. 16, 2006

(65) Prior Publication Data
US 2006/0193186 A1     Aug. 31, 2006

(30) Foreign Application Priority Data
Feb. 17, 2005     (JP)     ............... 2005-040928

(51) Int. Cl.
G06F 17/50     (2006.01)
(52) U.S. Cl. .................. 716/9; 716/1; 716/2; 716/11
(58) Field of Classification Search .................. 716/1, 716/2, 9, 11
See application file for complete search history.

(56) References Cited

U.S. PATENT DOCUMENTS 6,470,476 B2     10/2002     Bednar et al.
6,539,536 B1 *   3/2003      Singh et al. ............ 716/18

FOREIGN PATENT DOCUMENTS

JP          11-220028        10/1999

* cited by examiner

*Primary Examiner*—Thuan Do
(74) *Attorney, Agent, or Firm*—DLA Piper LLP (US)

(57) ABSTRACT

Upon designing a standard cell type semiconductor chip, there are prepared a plurality of types of standard cells and a plurality of types of yield improvement standard cells having the same function as the standard cells and having a layout which is changed to improve yield. A priority order list to be used upon replacing the plurality of types of first standard cells is generated. Automatic placement is performed by using the plurality of types of first standard cells. A certain type of a first standard cell is selected from the plurality of types of first standard cells according to a priority order in the generated list. The selected type of a first standard cell is replaced with a corresponding type of a second standard cell.

8 Claims, 4 Drawing Sheets

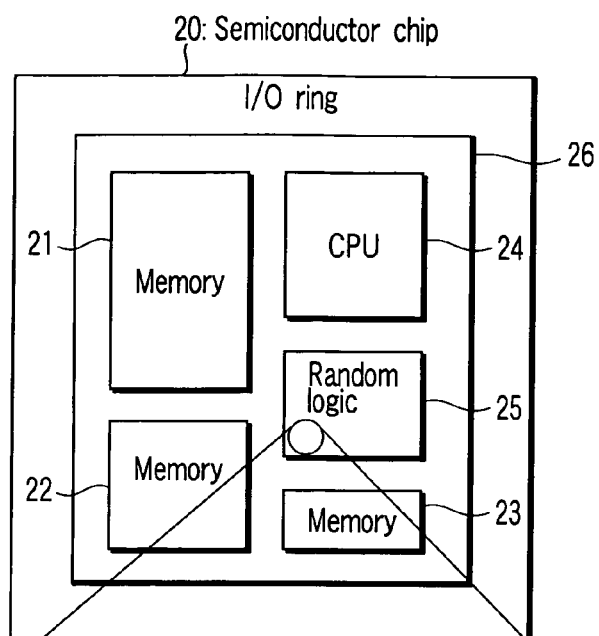
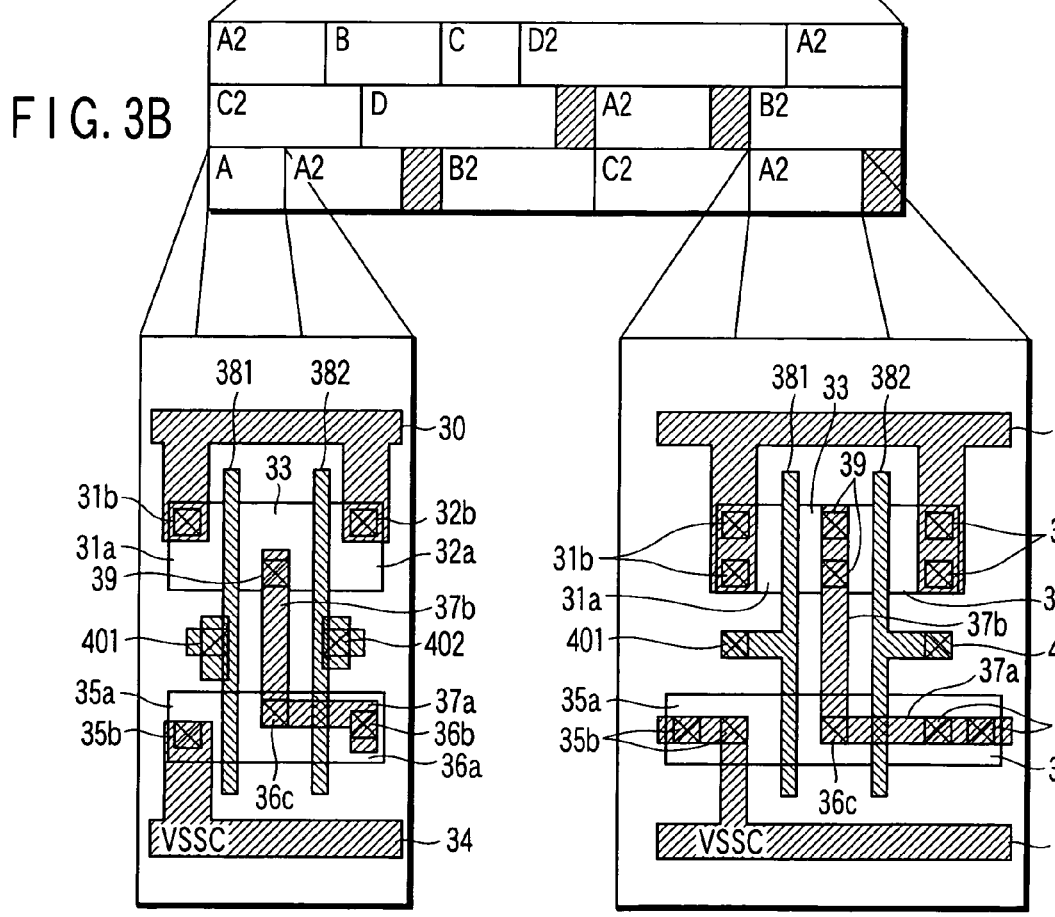
FIG. 3A
FIG. 3B
FIG. 3C
FIG. 3D

FIG. 5A

| A-1 | B-1 | C-1 | D-1 | | A-2 |
|---|---|---|---|---|---|
| C-2 | D-2 | | A-3 | B-2 | |
| A-4 | A-5 | B-3 | C-3 | A-6 | |

If there is enough space around normal cell A, cell A is replaced with yield improvement cell A2.

FIG. 5B

| A2-1 | B-1 | C-1 | D-1 | | A2-2 |
|---|---|---|---|---|---|
| C-2 | D-2 | | A2-3 | B-2 | |
| A-4 | A2-4 | B-3 | C-3 | A2-5 | |

If there is enough space around normal cell B, cell B is replaced with yield improvement cell B2.

FIG. 5C

| A2-1 | B-1 | C-1 | D-1 | | A2-2 |
|---|---|---|---|---|---|
| C-2 | D-2 | | A2-3 | B2-1 | |
| A-4 | A2-4 | B-3 | C-3 | A2-5 | |

If there is enough space around normal cell C, cell C is replaced with yield improvement cell C2.

FIG. 5D

| A2-1 | B-1 | C-1 | D-1 | | A2-2 |
|---|---|---|---|---|---|
| C2-1 | D-2 | | A2-3 | B2-1 | |
| A-4 | A2-4 | B2-2 | C2-2 | A2-5 | |

If there is enough space around normal cell D, cell D is replaced with yield improvement cell D2.

FIG. 5E

| A2-1 | B-1 | C-1 | D2-1 | A2-2 |
|---|---|---|---|---|
| C2-1 | D-2 | | A2-3 | B2-1 |
| A-4 | A2-4 | B2-2 | C2-2 | A2-5 |

METHOD OF DESIGNING SEMICONDUCTOR CHIP AND PROGRAM FOR USE IN DESIGNING SEMICONDUCTOR CHIP

CROSS-REFERENCE TO RELATED APPLICATIONS

This application is based upon and claims the benefit of priority from prior Japanese Patent Application No. 2005-040928, filed Feb. 17, 2005, the entire contents of which are incorporated herein by reference.

BACKGROUND OF THE INVENTION

1. Field of the Invention

The present invention relates to a method of designing a standard cell type semiconductor chip and a program for use in designing a semiconductor chip. Furthermore, the present invention relates to a method of replacing a normal standard cell with a yield improvement standard cell which is prepared separately from the normal standard cell.

2. Description of the Related Art

Upon designing a standard cell type semiconductor chip, the chip yield can be improved by using a standard cell which adopts a pattern layout for improving yield (hereinafter referred to as a "yield improvement standard cell").

A yield improvement standard cell is a standard cell whose layout is designed to reduce the number of defects as compared with a normal standard cell. For example, given that the probability of defect occurrence during a process of forming a contact hole for establishing a connection between a source or drain region of a transistor and a metal routing is p. When there are "n" contact holes in a certain standard cell, there is a possibility that "p×n" defects on average may occur in the contact holes of the standard cell. In order to reduce the average number of defects in the standard cell, the contact holes may be doubled by forming two contact holes for each contact point. In this case, the defect probability per contact point is reduced from p to the square of p. Since the order of the value of p is one several hundred millionth, the square of p can be considered to be substantially zero.

For example, when five contact holes among ten contact holes in a certain standard cell are doubled, the average number of defects in the contact holes included in the standard cell is reduced from 10 p to 5 p. The relationship between the number of defects D in a standard cell and the chip yield Y can be expressed by the following equation 1:

$$Y = \exp(-\Sigma D) \qquad (1)$$

where $\Sigma D$ is the sum of the average numbers of defects in all standard cells that compose a chip (i.e., the average number of defects per chip). Thus, if the average number of defects in a chip can be reduced by reducing the number of defects in a standard cell, the chip yield is improved.

The layout of a yield improvement standard cell is created with an increased cell area such as the aforementioned doubling of contact holes. For this reason, a yield improvement standard cell is generally larger in size than a normal standard cell. Accordingly, the use of a yield improvement standard cell may increase the chip size.

Jpn. Pat. Appln. KOKAI Publication No. 11-220028 discloses that upon designing a standard cell type semiconductor chip, a replacement is performed on normal standard cells in order to improve the operating speed and to save power consumption. In this case, as basic cells all having the same function, a plurality of types of cells having different transistor channel lengths in standard cells are prepared, and a selection of which standard cell is used is made according to the purpose, whereby high-speed operation or low-power operation is made possible.

BRIEF SUMMARY OF THE INVENTION

According to an aspect of the present invention, there is provided a method of designing a standard cell type semiconductor chip, comprising: preparing a plurality of types of first standard cells and a plurality of types of second standard cells having the same function as the first standard cells and having a layout which is changed to improve yield; generating a priority order list to be used upon replacing the plurality of types of first standard cells; performing automatic placement by using the plurality of types of first standard cells; and selecting a certain type of a first standard cell from the plurality of types of first standard cells according to a priority order in the generated list, and replacing the selected type of a first standard cell with a corresponding type of a second standard cell.

BRIEF DESCRIPTION OF THE SEVERAL VIEWS OF THE DRAWINGS

FIG. 3A is a pattern layout diagram showing an example of a semiconductor chip which is designed by the method of designing a semiconductor chip of the present invention;

FIG. 3B is a pattern layout diagram showing a partial configuration of a random logic circuit which is formed in the semiconductor chip shown in FIG. 3A;

FIG. 3C is a plan view showing an exemplary pattern layout of a normal standard cell in the random logic circuit shown in FIG. 3B;

FIG. 3D is a plan view showing an exemplary pattern layout of a yield improvement standard cell in the random logic circuit shown in FIG. 3B;

FIGS. 5A to 5E are pattern layout diagrams sequentially showing a process of replacing normal standard cells in the random logic circuit shown in FIG. 3B with yield improvement standard cells in accordance with the flowchart shown in FIG. 4.

DETAILED DESCRIPTION OF THE INVENTION

Figure 1:
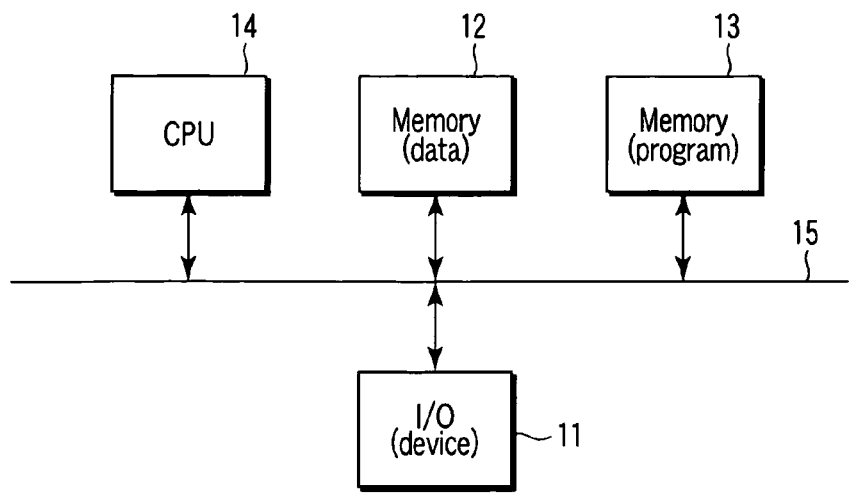
FIG. 1 is a block diagram showing an exemplary configuration of an automatic placement routing tool for use in a method of designing a semiconductor chip of the present invention.

Embodiments of the present invention will be described below with reference to the drawings. In the description, common parts are denoted by common reference numerals throughout the drawings.

(Configuration of Automatic Placement Routing Tool)

FIG. 1 shows an exemplary configuration of an automatic placement routing tool for use in a method of designing a semiconductor chip of the present invention. An I/O device 11 is composed of, for example, a magnetic tape device, a CD/DVD drive device, and a display device. Various data used to design a semiconductor chip are inputted to the I/O device 11, and the I/O device 11 outputs data obtained after designing. A memory 12 is composed of RAM, for example.

The memory 12 temporarily stores various data upon designing a semiconductor chip. A memory 13 is composed of ROM or RAM, for example. The memory 13 stores, for example, a control program used to design a semiconductor chip. A central processor unit (CPU) 14 is connected to the I/O device 11 and the memories 12 and 13 via a data bus 15. The CPU 14 reads and sequentially executes the control program stored in the memory 13, thereby controlling the operation of designing a semiconductor chip.

FIRST EMBODIMENT

Figure 2:
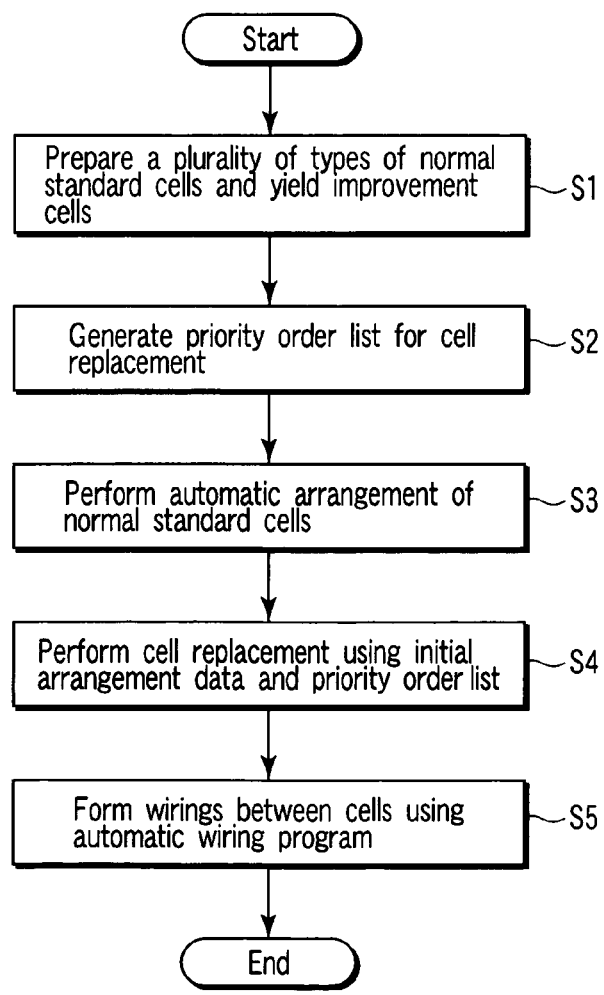
FIG. 2 is a flowchart showing a method of designing a semiconductor chip according to a first embodiment.

FIG. 2 is a flowchart showing a summary of processing steps performed by a control program which is stored in the memory 13 and which is executed on the CPU 14 upon designing a semiconductor chip. In a method of designing a standard cell type semiconductor chip according to the first embodiment, there are prepared a plurality of types of normal standard cells and a plurality of types of cells (hereinafter referred to as "yield improvement standard cells") having the same function as the normal standard cells and having a pattern layout which is changed to improve yield.

After automatic placement is performed by using the plurality of types of normal standard cells, at least part of the plurality of types of normal standard cells is replaced with a corresponding yield improvement standard cell. Upon this replacement, the amount (the amount of reduction in the average number of defects) A to which the average number of defects is reduced by a single replacement of a normal standard cell with a corresponding yield improvement cell on a type-by-type basis, the amount (the amount of increase in cell size) B to which the cell area is increased by a single replacement, or A/B by a single replacement is expressed in numeric terms in advance, and a priority order list for a cell replacement is generated. Higher priority is assigned to the standard cell which has greater than A, smaller than B or greater than A/B. Upon cell replacement, cells are replaced in the order of higher priority and greater effect.

FIG. 3A shows an example of a semiconductor chip fabricated by using standard cells upon designing. The semiconductor chip 20 has first to third memories 21, 22, and 23, a CPU 24, and a random logic circuit 25 provided within a core of its central portion. In a peripheral region surrounding the core, an I/O ring 26 is provided.

FIG. 3B shows an exemplary partial configuration of the random logic circuit 25 shown in FIG. 3A. The random logic circuit 25 is designed by using standard cells. In FIG. 3B, standard cells A, B, C, and D are normal standard cells of different types. Standard cells A2, B2, C2, and D2 are yield improvement standard cells that replace normal standard cells A, B, C and D, respectively. The standard cells A2, B2, C2, and D2 respectively have the same function as the normal standard cells A, B, C and D and are of the same type as the standard cell A, B, C and D, and also have pattern layout which are changed to improve yield. Note that regions in FIG. 3B which are cross-hatched by lines indicate room (space) where no standard cells are provided.

FIG. 3C shows an exemplary normal standard cell A shown in FIG. 3B. This standard cell A is a NAND circuit having two inputs.

In FIG. 3C, reference numeral 30 denotes a power supply routing to which a power supply voltage VDDC is supplied; 31a denotes a source region of a first PMOS transistor; 31b denotes a first source contact where the source region 31a of the first PMOS transistor comes into contact with the power supply routing 30; 32a denotes a source region of a second PMOS transistor; 32b denotes a second source contact where the source region 32a of the second PMOS transistor comes into contact with the power supply routing 30; and 33 denotes a drain region shared by the two PMOS transistors.

Reference numeral 34 denotes a ground routing to which a ground potential VSSC is supplied; 35a denotes a source region of a first NMOS transistor; 35b denotes a third source contact where the source region 35a of the first NMOS transistor comes into contact with the ground routing 34; 36a denotes a drain region of a second NMOS transistor; 36c denotes a via that establishes a connection with a cell output signal line of an upper layer; 37a denotes a routing portion that connects between the drain region 36a of the second NMOS transistor and the via 36c; and 36b denotes a drain contact where the drain region 36a of the second NMOS transistor comes into contact with the routing portion 37a.

Reference numeral 381 denotes a first gate routing that forms a gate electrode of the first PMOS transistor and a gate electrode of the first NMOS transistor. Reference numeral 382 denotes a second gate routing that forms a gate electrode of the second PMOS transistor and a gate electrode of the second NMOS transistor. Reference numeral 37b denotes a routing portion that connects between the drain region 33 shared by the two PMOS transistors and the via 36c; and 39 denotes a drain contact where the drain region 33 shared by the two PMOS transistors comes into contact with the routing portion 37b. Reference numeral 401 denotes a contact where the first gate routing 381 comes into contact with a control signal line of an upper layer; and 402 denotes a contact where the second gate routing 382 comes into contact with a control signal line of the upper layer.

FIG. 3D shows a diagram showing an exemplary yield improvement standard cell A2 shown in FIG. 3B. In the yield improvement standard cell A2, two contacts each used to connect between a source or drain region of a MOS transistor and a metal routing are formed for each contact point.

The pattern layout shown in FIG. 3D is same as from the pattern layout shown in FIG. 3C except that double contacts are provided such that two contacts are formed for each of the first source contact 31b, the second source contact 32b, the third source contact 35b, the drain contact 36b, and the drain contact 39. Further, the pattern layout shown in FIG. 3D is same as from the pattern layout shown in FIG. 3C except that a space between the first gate routing 381 and the first source contact 31b, a space between the second gate routing 382 and the second source contact 32b, a space between the first gate routing 381 and the third source contact 35b, a space between the second gate routing 382 and the drain contact 36b are broaden, respectively. These spaces are broadening to enhance the yield of the yield improvement standard cell.

Now, a method of designing a semiconductor chip will be described with reference to the flowchart of FIG. 2. There are prepared a plurality of types (for example, 300 to 400 types) of normal standard cells and a plurality of types (for example, 100 types) of yield improvement standard cells having the same function as at least part of the normal standard cells and having a pattern layout which is changed to improve yield. Data about the normal standard cells and the yield improvement standard cells are inputted from the I/O device 11 and then stored in the memory 12 via the data bus 15 and the CPU 14 (step S1). Examples of the data about the normal standard cells and the yield improvement standard cells include a pattern layout, such as routings and a diffusion layer, the average number of defects in a cell, and a cell area.

Based on the data about the normal standard cells and the yield improvement standard cells stored in the memory 12, a list indicating the priority order for cell replacement is prepared and then stored in the memory 12 (step S2).

Then, automatic placement of the normal standard cells are performed, and initial placement data after automatic placement is stored in the memory 12 (step S3).

A cell replacement is performed by using the initial placement data and the list indicating the priority order stored in the memory 12 (step S4).

Subsequently, routings are formed between the cells by using an automatic routing program (step S5).

Figure 4:
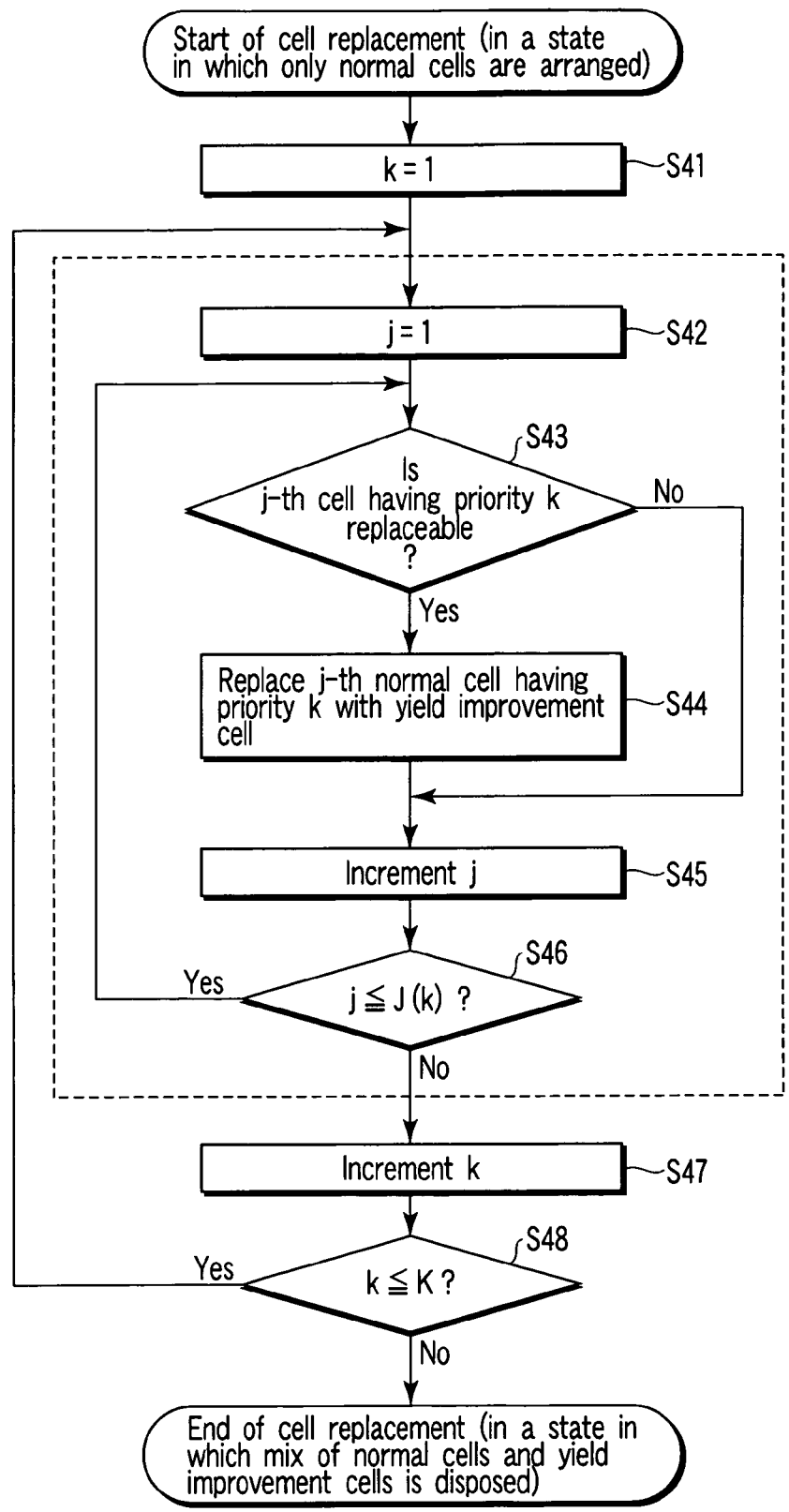
FIG. 4 is a flowchart showing a detail of a part of the flowchart shown in FIG. 2.

FIG. 4 shows a detailed configuration of the step S4 shown in FIG. 2.

Upon starting a cell replacement in a state in which only normal standard cells are arranged, first, a normal standard cell having a cell replacement priority k of 1, i.e., having the highest priority, is selected (step S41). In this case, the priority k is provided to a normal standard cell on a type-by-type basis. In the case where the number of types of normal standard cells is four as shown in FIG. 3B, the value of k is 1 to K (K=4).

A replacement of normal standard cells having a priority k (=1) is performed. First, among the normal standard cells having a priority k, a j-th (the initial j is 1) standard cell is selected (step S42). Then, it is determined whether or not the j-th standard cell having a priority k is replaceable (step S43). The determination as to whether or not the cell is replaceable is made by whether or not there is enough space, around the normal standard cell selected in step S42, to absorb an increase in cell size when the cell is replaced with a yield improvement standard cell.

If the cell is replaceable, the j-th standard cell having a priority k is replaced with a yield improvement standard cell (step S44). Thereafter, the value of j is incremented by one (step S45). On the other hand, if the cell is not replaceable, the value of j is incremented by one in step S45.

Subsequently, it is determined whether or not the value of j exceeds the number J(k) of the standard cells having a priority k used at initial placement (step S46). If the value does not exceed, processing returns to step S43, and it is determined whether or not a j-th standard cell having a priority k is replaceable. On the other hand, if the value exceeds, the value of k is incremented by one (step S47). Then, it is determined whether or not the value of k exceeds the number K (=4) of types of the normal standard cells (step S48). If the value does not exceed, processing returns to step S42, and a replacement of normal standard cells having a priority k of 2 which is the next highest priority after a priority k of 1 is performed. On the other hand, if the value exceeds, a cell replacement ends.

That is, as shown in the flowchart of FIG. 4, the process of replacing only replaceable normal standard cells with yield improvement standard cells in the order of higher priority is repeated until there is almost no replaceable space left.

FIGS. 5A to 5E show step-by-step processes of an exemplary cell replacement performed in accordance with the flowchart of FIG. 4.

FIG. 5A shows the placement of a plurality of type of normal standard cells at initial placement where only normal standard cells are used. Here, four types of standard cells A to D are arranged. The number of standard cells A is six (A-1 to A-6), the number of standard cells B is three (B-1 to B-3), the number of standard cells C is three (C-1 to C-3), and the number of standard cells D is two (D-1 and D-2). The priority order for the four types of standard cells A to D is such that the standard cells A have the highest priority, followed by B, C, and D. Note that regions in FIG. 5A which are cross-hatched by lines indicate room (space) where no standard cells are provided. At the initial placement, the space occupies approximately 30% to 40% of the entire area, for example.

In step S41 of FIG. 4, first, the normal standard cells A having the highest priority are selected. In the next step S42, a cell A-1 which is a first standard cell A is selected. Then, in the next step S43, it is determined whether or not there is enough space, around the cell A-1 which is the first standard cell A, to absorb an increase in cell size when the cell is replaced with a yield improvement standard cell. In this case, there is enough space around the cell A-1 which is the first standard cell A, and thus, as shown in FIG. 5B, the standard cell A-1 is replaced with a yield improvement standard cell A2-1. Likewise, a determination as to whether or not a cell is replaceable is made with respect to the rest of five normal standard cells A-2 to A-6. Only if a cell is determined to be replaceable, a normal standard cell is replaced with a yield improvement standard cell. In FIG. 5B, among the six normal standard cells A-1 to A-6, the first, second, third, fifth, and sixth standard cells A-1, A-2, A-3, A-5, and A-6 are replaced with yield improvement standard cells A2-1, A2-2, A2-3, A2-4, and A2-5, respectively.

Likewise, a replacement of the standard cells B having the next highest priority to that of the normal standard cells A is performed. FIG. 5C shows the placement of the standard cells after the standard cells B are replaced. In FIG. 5C, among the three normal standard cells B-1 to B-3, the second and third standard cells B-2 and B-3 are replaced with yield improvement standard cells B2-1 and B2-2, respectively.

Likewise, a replacement of the standard cells C having the next highest priority to that of the normal standard cells B is performed. FIG. 5D shows the placement of the standard cells after the standard cells C are replaced. In FIG. 5D, among the three normal standard cells C-1 to C-3, the second and third standard cell C-2 and C-3 are replaced with yield improvement standard cells C2-1 and C2-2, respectively.

Likewise, a replacement of the standard cells D having the next highest priority to that of the normal standard cells C is performed. FIG. 5E shows the placement of the standard cells after the standard cells D are replaced. In FIG. 5E, among the two normal standard cells D-1 and D-2, the first standard cell D-1 is replaced with a yield improvement standard cell D2-1. After a cell replacement, as shown in FIG. 5E, the space is reduced to approximately 10% to 20% of the entire area.

By the above-described method, the chip yield can be improved without causing an increase in chip size. In this case, since there are constrains on the area of space, a replacement cannot be performed on all of normal standard cells. Thus, replacement results vary depending on the algorithm of replacement. To put it in other words, the replacement may turn out to be good or poor depending on the replacement algorithm. In the case where various replacement results are obtained, a preferred replacement is that the chip yield is improved as much as possible, and the most preferred replacement is that the chip yield is maximized.

For the priority order for cells to be replaced, a cell having a large amount of reduction in the average number of defects by a single replacement should be given priority for replacement in order to improve chip yield. In addition, it is preferred that a cell having a small amount of increase in cell area by a single replacement is given priority for replacement because this allows another cell to be continuously replaced.

In the present embodiment, the amount A of reduction in the average number of defects by a single replacement of a normal standard cell with a corresponding yield improvement standard cell on a type-by-type basis, or the amount B of increase in cell size by a single replacement, or A/B is expressed in numeric terms in advance, and a priority order list is prepared. Then, upon cell replacement, a replacement is performed in the priority order, for example, in the order of larger amount A of reduction in the average number of defects or in the order of smaller amount B of increase in cell size by a single replacement, whereby the chip yield can be improved as much as possible. In other words, as the reference to determine the priority order for normal cells to be replaced, the descending order of A or the ascending order of B is employed. Preferably, by performing a replacement in descending order of A/B, the chip yield can be maximized.

According to the present embodiment, a replacement is performed without increasing chip size upon designing a standard cell type semiconductor chip, whereby the chip yield can be improved as much as possible.

SECOND EMBODIMENT

A method of designing a semiconductor chip according to a second embodiment is same as that according to the foregoing first embodiment except that initial automatic cell placement is performed by using, for a particular type of standard cells among a plurality of types of standard cells, a corresponding particular type of yield improvement standard cells, and by using the rest of the types of standard cells.

More specifically, in the method of designing a semiconductor chip according to the second embodiment, there are prepared, upon designing a standard cell type semiconductor chip, a plurality of types of normal standard cells and a plurality of types of yield improvement standard cells having the same function as the normal standard cells and having a layout which is changed to improve yield. Then, a priority order list used upon replacing standard cells is generated. Automatic placement is performed by using, for a particular type of standard cells among the plurality of types of standard cells, a corresponding particular type of yield improvement standard cells and by using the rest of the types of normal standard cells. At least part of the rest of the types of normal standard cells is replaced with a corresponding yield improvement standard cell in accordance with the priority order list. The priority order for replacement of standard cells is the descending order of a value obtained by (the average number of defects in a cell reduced by a single replacement)/ (the cell area increased by a single replacement).

In the second embodiment also, a replacement is performed without increasing chip size upon designing a standard cell type semiconductor chip, whereby the chip yield can be improved to the maximum.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of designing a standard cell type semiconductor chip, comprising:
preparing a plurality of types of first standard cells and a plurality of types of second standard cells having the same function as the first standard cells and having a layout which is changed to improve yield;
generating a priority order list to be used upon replacing said plurality of types of first standard cells;
performing automatic placement by using said plurality of types of first standard cells; and
selecting a certain type of a first standard cell from said plurality of types of first standard cells according to a priority order in the generated list, and replacing the selected type of a first standard cell with a corresponding type of a second standard cell,
wherein the priority order list is generated that said plurality of types of first standard cells are replaced with corresponding types of second standard cells in descending order of a value obtained by (an average number of defects in a standard cell reduced by a single replacement)/(a standard cell area increased by a single replacement).

2. A method of designing a standard cell type semiconductor chip, comprising:
preparing a plurality of types of first standard cells and a plurality of types of second standard cells having the same function as the first standard cells and having a layout which is changed to improve yield;
generating a priority order list to be used upon replacing said plurality of types of first standard cells;
performing automatic placement by using said plurality of types of first standard cells; and
selecting a certain type of a first standard cell from said plurality of types of first standard cells according to a priority order in the generated list, and replacing the selected type of a first standard cell with a corresponding type of a second standard cell,
wherein the priority order list is generated that said plurality of types of first standard cells are replaced with corresponding types of second standard cells in descending order of an amount of reduction in average number of defects by a single replacement.

3. A method of designing a standard cell type semiconductor chip, comprising:
preparing a plurality of types of first standard cells and a plurality of types of second standard cells having the same function as the first standard cells and having a layout which is changed to improve yield;
generating a priority order list to be used upon replacing said plurality of types of first standard cells;
performing automatic placement by using said plurality of types of first standard cells; and
selecting a certain type of a first standard cell from said plurality of types of first standard cells according to a priority order in the generated list, and replacing the selected type of a first standard cell with a corresponding type of a second standard cell,
wherein the priority order list is generated that said plurality of types of first standard cells are replaced with corresponding types of second standard cells in ascending order of a standard cell area increased by a single replacement.

4. A method of designing a standard cell type semiconductor chip, comprising:
preparing a plurality of types of first standard cells and a plurality of types of second standard cells having the same function as the first standard cells and having a layout which is changed to improve yield;
generating a priority order list to be used upon replacing said plurality of types of first standard cells;
performing automatic placement by using said plurality of types of first standard cells; and
selecting a certain type of a first standard cell from said plurality of types of first standard cells according to a priority order in the generated list, and replacing the selected type of a first standard cell with a corresponding type of a second standard cell;

wherein in each of the second standard cells, two contact holes are formed at a location corresponding to a point where at least part of a plurality of contact holes formed in each of the first standard cells is formed.

5. A method of designing a standard cell type semiconductor chip, comprising:

preparing a plurality of types of first standard cells and a plurality of types of second standard cells having the same function as the first standard cells and having a layout which is changed to improve yield;

generating priority order list to be used upon replacing said plurality of types of first standard cells;

performing automatic placement by using, for a particular type of a first standard cell among said plurality of types of first standard cells, a corresponding type of a second standard cell and by using a rest of the types of first standard cells; and selecting a certain type of a first standard cell from the rest of the types of first standard cells according to a priority order in the generated list, and replacing the selected type of a first standard cell with a corresponding type of a second standard cell, wherein the priority order list is generated that said plurality of types of first standard cells are replaced with corresponding types of second standard cells in descending order of a value obtained by (an average number of defects, in a standard cell reduced by a single replacement)/(a standard cell area increased by a single replacement).

6. A method of designing a standard cell type semiconductor chip, comprising:

preparing a plurality of types of first standard cells and a plurality of types of second standard cells having the same function as the first standard cells and having a layout which is changed to improve yield;

generating priority order list to be used upon replacing said plurality of types of first standard cells;

performing automatic placement by using, for a particular type of a first standard cell among said plurality of types of first standard cells, a corresponding type of a second standard cell and by using a rest of the types of first standard cells; and selecting a certain type of a first standard cell from the rest of the types of first standard cells according to a priority order in the generated list, and replacing the selected type of a first standard cell with a corresponding type of a second standard cell, wherein the priority order list is generated that said plurality of types of first standard cells are replaced with corresponding types of second standard cells in descending order of an amount of reduction in average number of defects by a single replacement.

7. A method of designing a standard cell type semiconductor chip, comprising:

preparing a plurality of types of first standard cells and a plurality of types of second standard cells having the same function as the first standard cells and having a layout which is changed to improve yield;

generating priority order list to be used upon replacing said plurality of types of first standard cells;

performing automatic placement by using, for a particular type of a first standard cell among said plurality of types of first standard cells, a corresponding type of a second standard cell and by using a rest of the types of first standard cells; and selecting a certain type of a first standard cell from the rest of the types of first standard cells according to a priority order in the generated list, and replacing the selected type of a first standard cell with a corresponding type of a second standard cell, wherein the priority order list is generated that said plurality of types of first standard cells are replaced with corresponding types of second standard cells in ascending order of a standard cell area increased by a single replacement.

8. A method of designing a standard cell type semiconductor chip, comprising:

preparing a plurality of types of first standard cells and a plurality of types of second standard cells having the same function as the first standard cells and having a layout which is changed to improve yield;

generating priority order list to be used upon replacing said plurality of types of first standard cells;

performing automatic placement by using, for a particular type of a first standard cell among said plurality of types of first standard cells, a corresponding type of a second standard cell and by using a rest of the types of first standard cells; and selecting a certain type of a first standard cell from the rest of the types of first standard cells according to a priority order in the generated list, and replacing the selected type of a first standard cell with a corresponding type of a second standard cell, wherein in each of the second standard cells, two contact holes are formed at a location corresponding to a point where at least part of a plurality of contact holes formed in each of the first standard cells is formed.

* * * * *